(12) United States Patent
Mahler

(10) Patent No.: US 10,644,175 B2
(45) Date of Patent: May 5, 2020

(54) METHODS OF INCREASING THE THICKNESS OF COLLOIDAL NANOSHEETS AND MATERIALS CONSISTING OF SAID NANOSHEETS

(71) Applicant: NEXDOT, Paris (FR)

(72) Inventor: Benoit Mahler, Paris (FR)

(73) Assignee: NEXDOT, Paris (FR)

( * ) Notice: Subject to any disclaimer, the term of this patent is extended or adjusted under 35 U.S.C. 154(b) by 118 days.

(21) Appl. No.: 15/582,996

(22) Filed: May 1, 2017

(65) Prior Publication Data

US 2017/0236959 A1 Aug. 17, 2017

Related U.S. Application Data

(62) Division of application No. 14/352,873, filed as application No. PCT/FR2012/052393 on Oct. 19, 2012, now Pat. No. 9,670,062.

(30) Foreign Application Priority Data

Oct. 19, 2011 (FR) ..................................... 11 03184

(51) Int. Cl.
    *B05D 1/36* (2006.01)
    *H01L 31/0352* (2006.01)
    (Continued)

(52) U.S. Cl.
    CPC ...... *H01L 31/035218* (2013.01); *B01J 27/04* (2013.01); *B01J 27/0573* (2013.01);
    (Continued)

(58) Field of Classification Search
CPC .... B01J 35/0013; B82B 1/005; B82B 3/0033; B82Y 15/00; H01L 21/02601
(Continued)

(56) References Cited

U.S. PATENT DOCUMENTS

2009/0315016 A1   12/2009  Elam et al.
2013/0220405 A1 *  8/2013  Mahler .................. B82Y 30/00
                                          136/252

FOREIGN PATENT DOCUMENTS

WO    WO-2012056121 A1 *  5/2012 ............. B82Y 30/00

OTHER PUBLICATIONS

International Search Report, dated Feb. 20, 2013, from corresponding PCT application No. PCT/FR2012/052393.
(Continued)

*Primary Examiner* — Alexander M Weddle
(74) *Attorney, Agent, or Firm* — Young & Thompson

(57) ABSTRACT

A process of growth in the thickness of at least one facet of a colloidal inorganic sheet. By sheet is meant a structure having at least one dimension, the thickness, of nanometric size and lateral dimensions great compared to the thickness, typically more than 5 times the thickness. By homostructured is meant a material of homogeneous composition in the thickness and by heterostructured is meant a material of heterogeneous composition in the thickness. The process allows the deposition of at least one monolayer of atoms on at least one inorganic colloidal sheet, this monolayer being constituted of atoms of the type of those contained or not in the sheet. Homostructured and heterostructured materials resulting from such process as well as the applications of the materials are also described.

11 Claims, 4 Drawing Sheets

(51) Int. Cl.
  B82Y 15/00 (2011.01)
  H01L 21/02 (2006.01)
  B05D 1/00 (2006.01)
  B82B 1/00 (2006.01)
  B82B 3/00 (2006.01)
  B01J 27/04 (2006.01)
  B01J 27/057 (2006.01)
  B01J 35/00 (2006.01)
  B01J 35/02 (2006.01)
  B01J 35/06 (2006.01)
  H01L 29/12 (2006.01)

(52) U.S. Cl.
  CPC ....... *B01J 27/0576* (2013.01); *B01J 35/0013* (2013.01); *B01J 35/023* (2013.01); *B01J 35/06* (2013.01); *B05D 1/00* (2013.01); *B82B 1/005* (2013.01); *B82B 3/0033* (2013.01); *B82Y 15/00* (2013.01); *H01L 21/02521* (2013.01); *H01L 21/02601* (2013.01); *H01L 21/02628* (2013.01); *H01L 29/127* (2013.01); *Y10T 428/2991* (2015.01); *Y10T 428/2993* (2015.01)

(58) Field of Classification Search
  USPC ........................................................ 427/215
  See application file for complete search history.

(56) References Cited

OTHER PUBLICATIONS

Cai et al., "TiO2 coated SnO2 nanosheet films for dye-sensitized solar cells", Thin Solid Films 519 (2011), pp. 5643-5648.
Zhang et al., "Aqueous Layer-by-Layer Epitaxy of Type-II CdTe/CdSe Quantum Dots with Near-Infrared Fluorescence for Bioimaging Applications", Small (2009), vol. 5, No. 2, pp. 185-189.
Ekimov et al., "Quantum size effect in three-dimensional microscopic semiconductor crystals", JETP Lett., Sep. 20, 1981, vol. 34, No. 6, pp. 345-348.
A. P. Alivisatos, "Semiconductor Clusters, Nanocrystals, and Quantum Dots", Science, Feb. 16, 1996, vol. 271, No. 5251,pp. 933-937.
Vassiliou et al., "Magnetic and optical properties of γ-Fe2O3 nanocrystals", J. Appl. Phys., May 15, 1993, vol. 73, No. 10, pp. 5109-5116.
El-Sayed, "Small is different: Shape-, size-, and composition-dependent properties of some colloidal semiconductor nanocrystals", Accounts of Chemical research, 2004, vol. 37, No. 5, pp. 326-333.
Ma et al., "Nanosheets of Oxides and Hydroxides: Ultimate 2D Charge-Bearing Functional Crystallites", Advanced Materials, 2010, vol. 22, pp. 5082-5104.
Sasaki et al., "Semiconductor Nanosheet Crystallites of Quasi-TiO2 and Their Optical Properties", The Journal of Physical Chemistry B, 1997, vol. 101, No. 49, pp. 10159-10161.
Hernandez et al., "High-yield production of graphene by liquid-phase exfoliation of graphite", J. N. Nature Nanotechnology, Sep. 2008, vol. 3, pp. 563-568.
Vaughn et al., "Single-Crystal Colloidal Nanosheets of GeS and GeSe", Journal of the American Chemical Society, 2010, vol. 132, pp. 15170-15172.
Mehta et al., "Seebeck Tuning in Chalcogenide Nanoplate Assemblies by Nanoscale Heterostructuring", ACS Nano, 2010, vol. 4, No. 9, pp. 5055-5060.
Kumar et al., "Shape control of II-VI semiconductor nanomaterials", Small, 2006, vol. 2, No. 3, pp. 316-329.
Jun et al., "Shape Control of Semiconductor and Metal Oxide Nanocrystals through Nonhydrolytic Colloidal Routes", Angewandte Chemie (International Ed. in English), 2006, vol. 45, pp. 3414-3439.
Xu et al., "Selective synthesis of copper nanoplates and nanowires via a surfactant-assisted hydrothermal process", Materials Chemistry and Physics, 2010, vol. 120, pp. 1-5.

Li et al., "Mass Synthesis of Large, Single-Crystal Au Nanosheets Based on a Polyol Process", Advanced Functional Materials, 2006, vol. 16, pp. 83-90.
Sigman et al., "Solventless Synthesis of monodisperse Cu2S nanorods, nanodisks, and nanoplatelets", Journal of the American Chemical Society, 2003, vol. 125, pp. 16050-16057.
Deng et al., "Synthesis of two-dimensional single-crystal berzelianite nanosheets and nanoplates with near-infrared optical absorption", Journal of Materials Chemistry, 2009, vol. 19, pp. 6201-6206.
Puntes et al., "Synthesis of hcp-Co Nanodisks", Journal of the American Chemical Society, 2002, vol. 124, pp. 12874-12880.
Si et al., "Rare-Earth oxide nanopolyhedra, nanoplates, and nanodisks", Angewandte Chemie (International ed. in English), 2005, vol. 44, pp. 3256-3260.
Zhang et al., "Large-Scale Aqueous Synthesis and Growth Mechanism of Single-Crystalline Metal Nanoscrolls at Room Temperature: The Case of Nickel", Chemistry of Materials, 2010, vol. 22, No. 16, pp. 4721-4727.
Sun et al., "Shape-Controlled Synthesis of Gold and Silver Nanoparticles", Science, Dec. 13, 2002, vol. 298, pp. 2176-2179.
Ah et al., "Size-Controlled Synthesis of Machinable Single Crystalline Gold Nanoplates", Chemistry of Materials, 2005, vol. 17, No. 22, pp. 5558-5561.
Huang et al., "Investigation of the Growth Process of Gold Nanoplates Formed by Thermal Aqueous Solution Approach and the Synthesis of Ultra-Small Gold Nanoplates", The Journal of Physical Chemistry C, 2007, vol. 111, No. 6, pp. 2533-2538.
Deng et al., "New Method to Single-Crystal Micrometer-Sized Ultra-Thin Silver Nanosheets: Synthesis and Characterization", The Journal of Physical Chemistry C, 2009, vol. 113, No. 3, pp. 867-873.
Yu et al., "Single unit cell thick samaria nanowires and nanoplates", Journal of the American Chemical Society, 2006, vol. 128, No. 6, pp. 1786-1787.
Xu et al., "Single-Crystal Metal Nanoplatelets: Cobalt, Nickel, Copper, and Silver", Crystal Growth & Design, 2007, vol. 7, No. 9, pp. 1904-1911.
Yu et al., "Synthesis and Characterization of Porous Magnesium Hydroxide and Oxide Nanoplates", The Journal of Physical Chemistry B, 2004, vol. 108, No. 1, pp. 64-70.
Joo et al., "Low-Temperature Solution-Phase Synthesis of Quantum Well Structured CdSe Nanoribbons", Journal of the American Chemical Society, 2006, vol. 128, No. 17, pp. 5632-5633.
Yu et al., "Giant Zeeman splitting in nucleation-controlled doped CdSe:Mn2+ quantum nanoribbons", Nature Materials, Jan. 2010, vol. 9, pp. 47-53.
Yu et al., "Shape and Phase Control of ZnS Nanocrystals: Template Fabrication of Wurtzite ZnS Single-Crystal Nanosheets and ZnO Flake-like Dendrites from a Lamellar Molecular Precursor ZnS-(NH2 CH2 CH2 NH2)0.5", Advanced Materials, Feb. 19, 2002, vol. 14, No. 4, pp. 296-300.
Li et al., "Hydrothermal synthesis of novel sandwich-like structured ZnS/octylamine hybrid nanosheets", Solid State Communications, 2004, vol. 130, pp. 619-622.
Yao et al., "Flexible Wurtzite-Type ZnS Nanobelts with Quantum-Size Effects: a Diethylenetriamine-Aassisted Solvothermal Approach", Small, 2005, vol. 1, No. 3, pp. 320-325.
Fan et al., "Solvothermal Synthesis and Photoluminescent Properties of ZnS/Cyclohexylamine: Inorganic-Organic Hybrid Semiconductor Nanowires", The Journal of Physical Chemistry B, 2006, vol. 110, No. 26, pp. 12948-12953.
Park et al., "Synthesis, Optical Properties, and Self-Assembly of Ultrathin Hexagonal In2S3 Nanoplates", Angewandte Chemie (International ed. in English), 2006, vol. 45, pp. 4608-4612.
Hu et al., "Hydrothermal Precursor Approach to Single-crystal PbS Nanosheets at Low Temperature", Chinese Journal of Inorganic Chemistry, Aug. 2007, vol. 23, No. 8, pp. 1403-1408.
Huang et al., "From single to multiple atomic layers: a unique approach to the systematic tuning of structures and properties of inorganic-organic hybrid nanostructured semiconductors", Journal of the American Chemical Society, 2007, vol. 129, No. 11, pp. 3157-3162.

(56) References Cited

OTHER PUBLICATIONS

Huang et al., "From 1D chain to 3D network: tuning hybrid II-VI nanostructures and their optical properties", Journal of the American Chemical Society, 2003, vol. 125, No. 23, pp. 7049-7055.

Son et al., "Large-scale soft colloidal template synthesis of 1.4 nm thick CdSe nanosheets", Angewandte Chemie (International ed. in English), 2009, vol. 48, pp. 6861-6864.

Ithurria et al., "Quasi 2D colloidal CdSe platelets with thicknesses controlled at the atomic level", Journal of the American Chemical Society, 2008, vol. 130, No. 49, pp. 16504-16505.

Ithurria et al., "Continuous transition from 3D to 1D confinement observed during the formation of CdSe nanoplatelets", Journal of the American Chemical Society, 2011, vol. 133, pp. 3070-3077.

Li et al., "Size/shape-controlled synthesis of colloidal CdSe quantum disks: ligand and temperature effects", Journal of the American Chemical Society, 2011, vol. 133, XP-002678847, pp. 6578-6586.

Hines et al., "Synthesis and Characterization of Strongly Luminescing ZnS-Capped CdSe Nanocrystals", The Journal of Physical Chemistry, 1996, vol. 100, No. 2, pp. 468-471.

Xiaogang Peng, "Green chemical approaches toward high-quality semiconductor nanocrystals", Chemistry Eur. J., 2002, vol. 8, No. 2, pp. 334-339.

Trindade et al., "Synthesis of CdS and CdSe Nanocrystallites Using a Novel Single-Molecule Precursors Approach", Chemistry of Materials, 1997, vol. 9, No. 2, pp. 523-530.

Mane et al., "Chemical deposition method for metal chalcogenide thin films", Materials Chemistry and Physics, 2000, vol. 65, pp. 1-31.

Y.F. Nicolau, "Solution deposition of thin solid compound films by a successive ionic-layer adsorption and reaction process", Applications of Surface Science, 1985, vol. 22/23, pp. 1061-1074.

Cai et al., "TiO2 coated SnO2 nanosheet films for dye-sensitized solar cells", Thin Solid Films, 2011, vol. 519, No. 16, pp. 5645-5648.

Lai et al., "A facile method for synthesis of Ag/TiO2 nanostructures", Materials Letters, 2008, vol. 62, No. 21-22, pp. 3688-3690.

Li et al., "Preparation, conversion, and comparison of the photocatalytic property of Cd(Oh)2, CdO, CdS and CdSe", Journal of Physics and Chemistry of Solids, 2009, vol. 70, No. 9, pp. 1285-1289.

Yu et al. "Electronic transport of n-type CdSe quantum dot films: Effet of film treatment", Journal of Applied Physics 2006, vol. 99, No. 10, pp. 104315-104315-7.

\* cited by examiner

METHODS OF INCREASING THE THICKNESS OF COLLOIDAL NANOSHEETS AND MATERIALS CONSISTING OF SAID NANOSHEETS

FIELD OF INVENTION

The present invention relates to a process for growing in the thickness at least one face of an inorganic colloidal nanosheet. The invention also relates to the homostructured or heterostructured materials resulting of said process as well as the applications of said materials. By nanosheet is meant a structure having at least one dimension, the thickness, of nanometric size and lateral dimensions that are great compared to the thickness, typically more than 5 times the thickness. By homostructured is meant a material of homogeneous composition in the thickness and by heterostructured is meant a material of heterogeneous composition in the thickness.

The present invention relates in particular to a process allowing the deposition of at least one monolayer of atoms on at least one inorganic colloidal nanosheet, said monolayer being constituted of atoms that are identical or not to the atoms contained in said nanosheet.

STATE OF THE ART

The fabrication of structures having at least one nanometric dimension induces the appearance of new physical properties. These structures have characteristics that may significantly differ from those of the bulk material of the same chemical composition.

These small dimensions (at the nanometric scale) indeed lead to a modification of the electronic[1], optic[2], magnetic[3] or plasmonic[4] properties.

These new materials thus generate a growing interest in fields as diverse as optics, imaging, electronics or catalysis.

The various existing nanostructures can be classified depending on the number of nanometric-size dimensions they present. Thus, an isotropic nanocrystal is a nanometric structure in the three dimensions, while a nanowire is a nanometric structure in two dimensions.

The present invention relates to nanometric structures in one dimension, i.e. nanosheets, which we shall subsequently call either sheets or nanosheets. It relates more particularly to colloidal nanosheets, i.e. the nanosheets that can be dispersed in solution. The present invention relates to the further growth of nanosheets, i.e. the growth in the thickness of an initial nanosheet.

The synthesis of colloidal inorganic nanosheets has experienced strong growth since the early 2000s. It is possible to distinguish several types of syntheses, each associated with a set of different materials. The main existing approaches, which will be detailed in the following, are direct exfoliation of a lamellar material, chemical synthesis of monosheets of lamellar materials, growth of nanosheets by poisoning (which blocks the growth) some crystalline facets with ligands, and finally a passage by an intermediate compound of lamellar structure undergoing a topotactic transformation.

Direct exfoliation is commonly used to produce nanosheets of graphene, hydroxides or oxides[5] (e.g. $TiO_2$). The method of preparation generally consists in reducing the interaction energy between the nanosheets in order to mechanically separate them thereafter. In the case of ionic compounds one induces a swelling of the inter-sheets space (generally containing positive ions) by exchanging the cations with a highly hindered ion such as tetrabutylammonium hydroxide[6]. This swelling weakens the interaction between the nanosheets which can then be separated mechanically by sonication for example. In the case of graphite, the reduction of the inter-sheets interaction energy may be achieved by the use of a suitable solvent such as N-methylpyrrolidone[7]. This type of process always results in the production of monosheets a few Angstroms thick. No further growth is possible. The size of the nanosheets depends on the size of the exfoliated bulk object. A control of the thickness of the nanosheet is not feasible, said thickness being fixed by the lamellar structure of the starting compound and therefore by its chemical nature.

There are also many direct syntheses of mono-sheets. It is for example possible to grow graphene directly on a copper substrate. It is also possible by synthetic methods in solution to directly prepare monosheets of GeS or GeSe[8] or even multiple sheets of $Bi_2Te_3$[9]. These syntheses, however, do not allow a control of the thickness of the nanosheets or their subsequent growth in the thickness.

A much more versatile approach allowing the fabrication of nanosheets in a wide variety of different materials is the poisoning of some crystalline facets by suitable surface ligands. The preferential adsorption of molecules on some crystalline facets of the material of interest blocks the growth in the perpendicular direction to these facets and thus induces a highly anisotropic crystalline growth[10,11]. It should be noted that the poisoning molecule can be of very varied nature: surfactants[12], polymers[13], thiols[14], amines[15,16,17], inorganic ions[18]. Materials so synthesized can be for example:

nanosheets of metals (PVP[13, 19, 20], CTAB[21] ions[18,22])
nanosheets of rare earths oxides[17,23] (oleic acid and/or oleylamine)
nanosheets of sulfides ($Cu_2S$ in the presence of thiols[14])

This manufacturing method, although very general, still has some limitations and in particular does not allow further growth in the thickness of an initial nanosheet.

Another approach consists in synthesizing nanosheets taking advantage of the formation of an intermediate that is also lamellar. This approach can be used to produce nanosheets of metal (Cobalt, Nickel or Copper[24]) or oxides (magnesium oxide MgO[25]) through a lamellar hydroxide. Similarly, many lamellar chalcogenides are obtained by prior formation of a metal-(primary amine) complex of lamellar structure which further reacts with a sulfur or selenium precursor. It is thus possible to form nanosheets of CdSe[26] of CdMnSe[27], of ZnS[28-31], or of $In_2S_3$[32]. It should be noted that a lamellar lead-thiourea complex also allows the formation of nanosheets of PbS[33]. This alternative approach has allowed for the first time to obtain chalcogenides nanosheets whose thickness is defined at the atomic monolayer. Thus, since 2001, synthesis protocols for making hybrid organic/inorganic lamellar semiconductor materials have appeared[34]. The elemental nanosheet of these materials is constituted by a semiconducting monolayer or bilayer (ZnS[35] for example), in wurtzite structure, of [1, 1, 0] zone axis, whose surface is stabilized by a primary amine. This very general synthesis protocol can be applied to a variety of materials: CdSe, CdS, ZnS, ZnSe, ZnTe . . . This approach was partially amended in 2006 in order to obtain individual CdSe nanosheets simply by varying the length of the alkyl chain of the primary amine[26,36]. Control of the thickness of such nanosheets remains limited and their thickness does not exceed 5 monolayers. Consequently, the optical properties of these nanosheets are very limited: fluorescence circumscribed in the blue and ultraviolet regions of the visible spectrum, full width at half maximum of the fluorescence peak greater than 12 nm. In addition, further growth in the thickness remains impossible on these nanosheets.

More recently, in 2008, a new approach that significantly improves the control of the thickness of the synthesized semiconductor nanosheets was developed[37-39]. In this case, the nanosheets comprise a semiconductor nanosheet (CdSe, CdS or CdTe) of zinc-blende structure, of [0, 0, 1] zone axis having a cationic layer stabilized by carboxylates on each side of the nanosheet. This type of synthesis allows controlling precisely the thickness of the semiconductor nanosheet, which can be between 4 and 11 monolayers depending on the synthesis protocol used. Such colloidal semiconductor nanosheets have innovative electronic and optical properties, in particular because of their perfectly controlled thickness. Thus, the fluorescence of these objects is characterized by a very narrow emission spectrum (less than 10 nm full width at half maximum) and the accessible wavelengths in fluorescence cover the entire visible spectrum. However, this new approach does not allow further growth in the thickness of an initial nanosheet.

Thus, current methods allow synthesizing nanosheets whose thickness is not always well controlled.

Currently there are also two types of methods of growth in solution of films of semiconductors on an initial material: processes of growth on colloidal nanocrystals and processes of growth on substrate.

In the case of growth processes on colloidal nanocrystals such as "quantum dots" (semiconductor nanocrystals), known growth processes involve an excess of ligands and high temperatures (over 200° C.)[40-42]. Under such conditions, it is very difficult to ensure the stability of the nanosheets. Indeed, because of their 2D structure, the nanosheets degrade and dissolve when these growth processes are used.

In the case of growth processes on a substrate, the known methods are carried out in aqueous solution and at ambient temperature. We distinguish the CBD: "Chemical Bath Deposition" growth in chemical bath[43] and the SILAR: "Successive Ion Layer Adsorption and Reaction" growth by adsorption and subsequent reaction of ionic layers[44]. These processes, in order to be applied to nanosheets, require a set of conditions that are difficult to meet, for example prior modification of the surface ligands of the nanosheets, a precise control of the pH or the absence of chelating agents (chelating agents that could lead to a dissolution of the nanosheets). The stability in solution of the inorganic semiconductor nanosheets is due to the presence of organic ligands and their interaction with the crystalline material. Changing these interactions by heating or removal of ligands causes aggregation or destruction of the nanosheets by dissolution or change in shape to a more stable thermodynamic structure.

Then, growth in the thickness of these objects is not possible with the known techniques described above.

None of the methods described above allows producing an inorganic particle comprising an initial nanosheet. However, this final material has numerous advantages: it is possible to cover all or part of the initial nanosheet by one or more layers of the same or different material from the material constituting the initial nanosheet, which allows obtaining a final material with very interesting properties, in terms of stability or optical properties.

The object of the present invention is therefore to provide a novel method for the further growth in the thickness of an initial nanosheet through deposition of at least one inorganic material layer on said initial nanosheet.

The present invention therefore allows obtaining inorganic particles comprising an inorganic nanosheet partially or completely covered with at least one layer of inorganic material.

SUMMARY

An object of the invention is an inorganic colloidal particle comprising an initial inorganic nanosheet partially or completely covered with at least one layer of inorganic material.

In one embodiment, said particle has a thickness of 0.5 nm to 10 mm.

In one embodiment, the lateral dimensions of said particle are at least 1.5 times its thickness.

In one embodiment, the material of the original sheet and the material of the at least one layer partially or completely covering the initial nanosheet comprise a material $M_xE_y$, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and not simultaneously equal to 0.

In one embodiment, the initial nanosheet and the at least one layer partially or completely covering the initial nanosheet are composed of the same material.

In one embodiment, the initial nanosheet and the at least one layer partially or completely covering the initial nanosheet are composed of at least two different materials.

In one embodiment, the initial nanosheet is partially or completely covered with at least 2 layers.

Another object of the invention is a process of growth in the thickness of at least one face of at least one initial nanosheet by deposition of at least one layer on all or part of the initial nanosheet, comprising contacting at least one initial nanosheet with at least one solution of precursors of the at least one layer.

In one embodiment, the initial nanosheet is dispersed in an organic medium.

In one embodiment, a stabilizing compound is furthermore added when contacting the initial nanosheet with the solution of precursors of the deposited material.

In one embodiment, the particles obtained after reaction are purified.

In one embodiment, the at least one initial nanosheet can be fixed on a substrate.

Another object of the invention is the use of said aforementioned nanoparticles or nanoparticles obtained by the process described above, as fluorescent agents, catalysis agents, absorbing and/or collecting elements of a photovoltaic cell or field effect transistor.

Another object of the invention is a luminescent or electroluminescent system or an amplifying stage of a laser comprising at least one aforementioned particle or a particle obtained by the process described above.

Another object of the invention is a catalyst comprising at least one aforementioned particle or a particle obtained by the process described above.

Another object of the invention is a photovoltaic cell comprising at least one aforementioned particle or a particle obtained by the process described above.

Another object of the invention is a transistor comprising at least one aforementioned particle or a particle obtained by the process described above.

DETAILED DESCRIPTION

For the purposes of the present invention, the terms sheets and nanosheets are equivalent. A nanosheet presents a quasi-2D crystalline structure whose at least one dimension, preferably the thickness, is less than 1 µm. The lateral dimensions, i.e. the width and the length, of the nanosheet are great compared to the thickness, i.e. at least 1.5 times greater. The nanosheet is anisotropic.

The increase in the initial nanosheet thickness allows significantly extending the spectral characteristics of said sheet such as emission or absorption spectra. It therefore seems desirable to develop a method of growth in the thickness to reach greater thicknesses. Furthermore, it would be desirable for many applications to be able to deposit on the initial nanosheet a material different from the one composing the nanosheet.

Thus, the final particles increased in their thickness according to the invention present new or improved properties compared to initial nanosheets, such as high quantum yield, increased stability, better surface stability, low fluorescence full width at half maximum (less than 30 nm, preferably less than 25 nm), a fast fluorescence lifetime (less than 40 ns, preferably less than 10 ns) a high absorption cross section (approximately or more than $10^{-13}$ cm$^2$ at 400 nm), possible tuning of the emission wavelength, robustness through time of the optical properties, a high specific surface.

The present invention therefore relates to a final particle or object comprising an initial nanosheet where at least a part of the particle has a thickness greater than the thickness of the initial nanosheet.

The present invention therefore relates to a final particle or object comprising an initial nanosheet partially or completely covered with at least one layer of additional material.

The present invention therefore relates to a final particle or object comprising an initial nanosheet partially or completely covered on a least one facet by at least one layer of additional material.

For the purpose of the present invention, the term "layer" refers to a film or a continuous or partial layer being at least one atom thick. The term "monolayer" refers to a film or a continuous or partial layer being one atom thick. The atoms composing the layer or the monolayer can be identical or different.

In one embodiment where several layers cover all or part of the initial nanosheet, these layers can be composed of the same material or composed of different materials.

In one embodiment where several layers cover all or part of the initial nanosheet, these layers can be composed such as to form a gradient of materials.

In one embodiment, the initial nanosheet is an inorganic colloidal nanosheet.

In one embodiment, the initial nanosheet is crystalline.

In one embodiment, the final particle or object is a nanosheet.

In one embodiment, the final particle or object is inorganic.

In one embodiment, the final particle or object is colloidal.

In one embodiment, the final particle or object is crystalline.

In one embodiment, the initial nanosheet comprised in the final particle or object has preserved its quasi-2D structure.

In one embodiment, the material covering the initial nanosheet is inorganic.

In one embodiment, at least one part of the final particle or object has a thickness greater than the thickness of the initial nanosheet.

In one embodiment, the final particle or object comprises the initial nanosheet totally covered with at least one layer of material.

In one embodiment, the final particle or object comprises the initial nanosheet totally covered with a first layer of material, said first layer being partially or completely covered with at least a second layer of material.

In one embodiment, the initial nanosheet has a thickness of 0.3 nm to less than 500 nm, of 5 nm to less than 250 nm, of 0.3 nm to less than 100 nm, of 0.3 nm to less than 50 nm, of 0.3 nm to less than 25 nm, of 0.3 nm to less than 20 nm, of 0.3 nm to less than 15 nm, of 0.3 nm to less than 10 nm, of 0.3 nm to less than 5 nm.

In one embodiment, at least one of the lateral dimensions (length or width) of the initial nanosheet is at least 1.5 times the thickness of the initial nanosheet, at least 2 times the thickness of the initial nanosheet, at least 2.5 times the thickness of the initial nanosheet, at least 3 times the thickness of the initial nanosheet, at least 3.5 times the thickness of the initial nanosheet, at least 4 times the thickness of the initial nanosheet, at least 4.5 times the thickness of the initial nanosheet, at least 5 times the thickness of the initial nanosheet.

In one embodiment, the lateral dimensions of the initial nanosheet are at least 0.45 nm to at least 2500 nm.

In one embodiment, at least one of the lateral dimensions of the initial nanosheet is from 2 nm to 1 m, from 2 nm to 100 mm, from 2 nm to 10 mm, from 2 nm to 1 mm, from 2 nm to 100 µm, from 2 nm to 10 µm, from 2 nm to 1 µm, from 2 nm to 100 nm, from 2 nm to 10 nm.

In one embodiment, the material composing the initial nanosheet comprises a material $M_xE_y$, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5.

In one embodiment, the semiconducting material composing the initial nanosheet comprises a compound of group II-VI, of group II-V, of group of group III-V, of group IV-VI, of group I-III-VI, of group II-IV-VI or of group II-IV-V or a mixture thereof.

In one embodiment, the material composing the initial nanosheet comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, GeS$_2$, GeSe$_2$, SnS$_2$, SnSe$_2$, CuInS$_2$, CuInSe$_2$, AgInS$_2$, AgInSe$_2$, CuS, Cu$_2$S, Ag$_2$S, Ag$_2$Se, Ag$_2$Te FeS, FeS$_2$, InP, Cd$_3$P$_2$, Zn$_3$P$_2$, CdO, ZnO, FeO, Fe$_2$O$_3$, Fe$_3$O$_4$, Al$_2$O$_3$, TiO$_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the initial nanosheet comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the initial nanosheet comprises at least one semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the final particle or object has a thickness of 0.5 nm to 10 mm, of 0.5 nm to 1 mm, of 0.5 nm to 100 µm, of 0.5 nm to 10 µm, of 0.5 nm to 1 µm, of 0.5 nm to 500 nm, of 0.5 nm to 250 nm, of 0.5 nm to 100 nm, of 0.5 nm to 50 nm, of 0.5 nm to 25 nm, of 0.5 nm to 20 nm, of 0.5 nm to 15 nm, of 0.5 nm to 10 nm, of 0.5 nm to 5 nm.

In one embodiment, at least one of the lateral dimensions (length or width) of the final particle or object represents at least 1.5 times the thickness of the final particle or object, at least 2 times the thickness of the final particle or object, at least 2.5 times the thickness of the final particle or object, at least 3 times the thickness of the final particle or object, at least 3.5 times the thickness of the final particle or object, at least 4 times the thickness of the final particle or object, at least 4.5 times the thickness of the final particle or object, at least 5 times the thickness of the final particle or object.

In one embodiment, the lateral dimensions of the final particle or object are at least 0.75 nm to at least 50 mm.

In one embodiment, at least one of the lateral dimensions of the final particle or object is 2 nm to 1 m, 2 nm to 100 mm, 2 nm to 10 mm, 2 nm to 1 mm, 2 nm to 100 µm, 2 nm to 10 µm, 2 nm to 1 µm, 2 nm to 100 nm, 2 nm to 10 nm.

In one embodiment, the final particle or object is homostructured, i.e. the initial nanosheet and the at least one layer are composed of the same material.

In one embodiment, the final particle or object is heterostructured, i.e. the initial nanosheet and the at least one layer are composed of at least two different materials.

In one embodiment, the final particle or object can comprise the initial nanosheet and at least one layer covering all or part of the initial nanosheet, said layer being composed of the same material as the initial nanosheet or a different material than the initial nanosheet.

In one embodiment, the final particle or object can comprise the initial nanosheet and 1, 2, 3, 4, 5 or more layers covering all or part of the initial nanosheet, said layers begin of same composition as the initial nanosheet or being of different composition than the initial nanosheet or being of different composition one another.

In one embodiment, the final particle or object can comprise the initial nanosheet and at least 2, 3, 4, 5 or more layers in which the first deposited layer covers all or part of the initial nanosheet and the at least second deposited layer covers all or part of the previously deposited layer, said layers being of same composition as the initial nanosheet or being of different composition than the initial nanosheet and possibly of different compositions one another.

Therefore in one embodiment, the final particle or object comprises the initial nanosheet completely covered with at least one continuous layer then completely or partially covered with at least another layer, said layers being of same composition as the initial nanosheet or being of different composition than the initial nanosheet and possibly being of different compositions one another.

In one embodiment, the final particle or object has a core/shell structure, i.e. an initial nanosheet of given composition covered on its entire surface by at least one layer of different composition than the initial nanosheet.

Therefore, the obtained material is composed of a pilling of films where at least one is of identical or different chemical composition than the initial nanosheet, the surface of each film completely covering the surface of the film on which it is deposited.

In one embodiment, the final particle or object has a dewetted structure, i.e. an initial nanosheet of given composition partially covered with at least one layer of the same or different composition than the initial nanosheet.

Therefore, the obtained material is composed of a pilling of films where at least one is of the same or different chemical composition than the initial nanosheet, the surface of each film partially covering the surface of the films on which it is deposited.

In one embodiment, the material composing the at least one layer comprises a material MxEy, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and non-simultaneously 0.

In one embodiment, the material composing the at least one layer comprises a compound of group II-VI, of group II-V, of group of group III-V, of group IV-VI, of group I-III-VI, of group II-IV-VI or of group II-IV-V or a mixture thereof.

In one embodiment, the material composing the at least one layer comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$ FeS, $FeS_2$ InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the at least one layer comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the at least one layer comprises at least one semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the final particle or object is not a nanosheet of $SnO_2$ covered with $TiO_2$.

In one embodiment, the final particle or object is not a nanosheet of $TiO_2$ covered with silver.

In one embodiment, the final particle or object is not a homostructured nanosheet composed of SnSe.

The present invention relates to a process of growth in the thickness of at least one face of at least one initial nanosheet by deposition of a film or a layer of material on the surface of the at least one initial nanosheet, the process comprising the introduction, in a medium containing at least one initial nanosheet, of one or more solutions of precursors containing at least one precursor of the material to be deposited.

Therefore the present invention also relates to a final particle or object obtained or obtainable by the process of the invention.

In one embodiment, the initial nanosheet is an inorganic nanosheet.

In one embodiment, the initial nanosheet is a colloidal nanosheet.

In one embodiment, the initial nanosheet is a semiconductor.

In one embodiment, the material composing the initial nanosheet is such as described above.

In one embodiment, the material composing the initial nanosheet comprises a material ExMy, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and non-simultaneously 0.

In one embodiment, the semiconducting material composing the initial nanosheet comprises a compound of group II-VI, of group II-V, of group III-VI, of group III-V of group IV-VI, of group I-III-VI, of group II-IV-VI or of group II-IV-V or a mixture thereof.

In one embodiment, the material composing the initial nanosheet comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$ FeS, $FeS_2$ InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the initial nanosheet comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the initial nanosheet comprises at least a semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the initial nanosheet is such as described above.

In one embodiment, the precursor of the material to be deposited is a precursor of a material that can be MxEy, where:

M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5.

In one embodiment, the precursor of the material to be deposited is a precursor of a compound of group II-VI, of group II-V, of group III-VI, of group III-V, of group IV-VI, of group I-III-VI, of group II-IV-VI or of group II-IV-V or a mixture thereof.

In one embodiment, the precursor of the material to be deposited is a precursor of at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the precursor of the material to be deposited is a precursor of at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the precursor of the material to be deposited is a precursor of at least one semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the film or the layer of material deposited comprises a MxEy composition comprising the elements M under a cationic form and E under an anionic form in stoichiometric ratio, the stoichiometric ratio being characterized by the x and y values corresponding to the absolute value of the oxidation states of elements E and M respectively.

In one embodiment, if E is a chalcogenide, the precursor of E is a compound containing the chalcogenide at the −2 oxidation state.

In one embodiment, if E is sulfur, the precursor of E is a salt containing $S^{2-}$ sulfide ions.

In one embodiment, the precursor of E comprises bis (trimethylsilyl) sulfide ($TMS_2S$) or hydrogen sulfide ($H_2S$) or sodium hydrogen sulfide (NaSH) or sodium sulfide ($Na_2S$) or ammonium sulfide ($S(NH_4)_2$) or thioruea or thioacetamide.

In one embodiment, if E is selenium, the precursor of E comprises a salt containing $Se^{2-}$ selenide ions.

In one embodiment, the precursor of E comprises bis (trimethylsilyl) selenide ($TMS_2Se$) or hydrogen selenide ($H_2Se$) or sodium selenide ($Na_2Se$) or sodium hydrogen selenide (NaSeH) or sodium selenosulfate ($Na_2SeSO_3$) or selenourea.

In one embodiment, if E comprises tellurium, the precursor of E is as salt containing $Te^{2-}$ telluride ions.

In one embodiment, the precursor of E comprises bis (trimethylsilyl) telluride ($TMS_2Te$) or hydrogen telluride ($H_2Te$) or sodium telluride ($Na_2Te$) or sodium hydrogen telluride (NaTeH) or sodium tellurosulfate ($Na_2TeSO_3$).

In one embodiment, if E is a chalcogenide, the precursor of E is formed in situ by reaction of a reducing agent with a compound containing E at the 0 oxidation state or at a strictly positive oxidation state.

In one embodiment, if E is oxygen, the precursor of E is the hydroxide ion ($HO^-$).

In one embodiment, if E is oxygen the precursor of E is a solution of sodium hydroxide (NaOH) or of potassium hydroxide (KOH) or of tetramethylammonium hydroxide (TMAOH).

In one embodiment, if E is phosphorus, the precursor of E comprises phosphorus at the −3 oxidation state.

In one embodiment, the precursor of E comprises tris (trimethylsilyl) phosphine ($TMS_3P$) or phosphine ($PH_3$) or white phosphorus ($P_4$) or phosphorus trichloride ($PCl_3$).

In one embodiment, if M is a metal, the precursor of M is a compound containing the metal at positive or 0 oxidation state.

In one embodiment, if M is a metal, the precursor of M comprises a metallic salt.

In one embodiment, the metallic salt is a carboxylate of M, or a chloride of M, or a nitrate of M, or a sulfate of M, or a thiolate of M.

In one embodiment, the film or the layer of MxEy composition deposited comprises a chalcogenide, a phosphide, a nitride, an arsenide or an oxide.

In one embodiment, the material composing the at least one layer comprises a material ExMy, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and non-simultaneously 0.

In one embodiment, the material composing the at least one layer comprises a compound of group II-VI, of group II-V, of group III-VI, of group III-V, of group IV-VI, of group I-III-VI, of group II-IV-VI or of group II-IV-V or a mixture thereof.

In one embodiment, the material composing the at least one layer comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$ FeS, $FeS_2$ InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the at least one layer comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the at least one layer comprises at least one semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the film or the layer deposited comprises an alloy of the aforementioned materials.

In one embodiment, the film or the layer deposited comprises a transition metal or a lanthanide in minor quantities (doping).

In one embodiment, the film or the layer deposited comprises in minor quantities an element inducing an excess or a defect of electrons compared to the sole film (electronic doping).

In one embodiment, the film or the layer deposited comprises a metal.

In one embodiment, the metal deposited is chosen among gold, silver, nickel, molybdenum, aluminum.

In one embodiment, a reducing agent can be introduced at the same time as the precursor/precursors of the film or layer to be deposited.

In one embodiment, the reducing agent comprises a hydride.

In one embodiment, the reducing agent comprises dihydrogen.

In one embodiment, the hydride comprises sodium tetrahydroborate ($NaBH_4$); sodium hydride (NaH), lithium tetrahydroaluminate ($LiAlH_4$), diisobutylaluminum hydride (DIBALH).

In one embodiment, the initial nanosheet is dispersed in a dispersing solvent.

In one embodiment, the dispersion medium is an organic medium, preferably apolar or weakly polar.

In one embodiment, the dispersing solvent of the nanosheets is chosen among distilled water, methanol, ethanol, isopropanol, butanol, chloroform, acetone, hexane, tetrahydrofuran, dimethylsulfoxide, toluene, octadecene and dimethylformamide In one embodiment, the dispersing solvent of the nanosheets is a supercritical fluid or an ionic liquid.

In one embodiment, a stabilizing compound capable of stabilizing the final particle(s) or object(s) can be introduced in the dispersing solvent.

In one embodiment, a stabilizing compound capable of stabilizing the final particle(s) or object(s) can be introduced in anyone of the precursor solutions.

In one embodiment, the stabilizing compound of the final particles or objects comprises an organic ligand.

In one embodiment, the organic ligand comprises a carboxylic acid, a thiol, an amine, a phosphine, an amide, an ester, a pyridine, an imidazole, an alcohol.

In one embodiment, the stabilizing compound of the final particles or objects is an ion.

In one embodiment, the stabilizing ion comprises a quaternary ammonium.

In one embodiment, the rate of introduction of the solution(s) of precursors is chosen such as the speed of growth in the thickness of the nanosheets is between 1 nm per second and 0.1 nm per hour.

In one embodiment, the rate of introduction of the solution(s) of precursors is chosen such as the speed of growth in the thickness of the nanosheets is between 1 nm per second and 0.1 nm per day.

In one embodiment, the solution(s) of precursors is/are added dropwise.

In one embodiment, the solution(s) of precursors is/are added in one portion directly in the reaction medium.

In one embodiment, the temperature of the reaction medium is set between 100° C. and 350° C.

In one embodiment, the temperature of the reaction medium is −80° C. to 150° C., 20° C. to 100° C., 40° C. to 80° C., approximately 60° C. (60° C.±5° C.).

In one embodiment, the temperature of the reaction medium is ambient temperature.

In one embodiment, the reaction time t of the precursor is lower than a few hours.

In one embodiment, the reaction time t of the precursor is lower than 24 h, or lower than 12 h, or lower than 6 h, or lower than 4 h, or lower than 2h, or lower than 1 h.

In one embodiment, the reaction time t of the precursor is lower than a few days.

In one embodiment, the excess of precursors is discarded after reaction.

In one embodiment, the final particle or object obtained after reaction of the precursor(s) on the initial nanosheets is purified.

In one embodiment, the purification is done by flocculation and/or precipitation, or by filtration.

In one embodiment, the initial nanosheet can be fixed on a least one substrate.

In one embodiment, the fixation of the initial nanosheet(s) on said substrate is done by adsorption or chemical coupling.

In one embodiment, said substrate is chosen among silica SiO2, aluminum oxide Al2O3, indium-tin oxide ITO, fluorine-doped tin oxide FTO, titanium oxide TiO2, gold, silver, nickel, molybdenum, aluminum, silicium, germanium, silicon carbide SiC, graphene and cellulose.

In one embodiment, said substrate comprises a polymer.

In one embodiment, an annealing process is performed in order to decrease the surface's roughness of the final particle or object.

The present invention also relates to the use of the final particles or objects described above.

Indeed, these final particles or objects further grown in the thickness have numerous advantages and properties such as high quantum yield, better stability, better surface stability, narrow full width at half maximum (less than 30 nm, preferably less than 25 nm), fast fluorescence lifetime (less than 40 ns, preferably less than 10 ns), a high absorption cross-section (approximately or more than $10^{-13}$ cm$^2$ at 400 nm), a possible tuning of the emission wavelength, a robustness through time of the optical properties, a high specific surface.

These different properties make the final particles or objects such as described above, useful objects for applications in fluorescence, especially in luminescent or electroluminescent systems or the amplification stage of a laser.

As an example, CdSe nanosheets covered with a CdS or a CdZnS shell as described in the examples have a high quantum yield that can be over 60% as well as a narrow fluorescence full width at half maximum (less than 20 nm). Other examples of final particles or objects useful for applications in fluorescence are CdS nanosheets covered with ZnS (CdS/ZnS), $CdSe_xS_{1-x}$ (x being a decimal number from 0 to 1) covered with $Cd_yZn_{1-y}S$ (y being a decimal number from 0 to 1) (CdSeS/CdZnS), CdTe nanosheets covered with $Cd_yZn_{1-y}Se_xS_{1-x}$ (x and y being decimal number independently from 0 to 1) (CdTe/CdZnSeS), CdS nanosheets covered with manganese(II) or copper(II)-doped ZnS CdS/ZnS:Mn or CdS/ZnS:Cu.

These final particles or objects such as described above are also useful as catalysts because of their high specific surface, their better stability, their great absorption cross-section.

CdS, ZnS and alloys thereof nanosheets and CdSe nanosheets can for example be covered with platinum and/or palladium sulfide. The obtained composite has a photocatalytic dihydrogen production activity. Other examples of final particles or objects useful in catalytic applications are CdS or CdSe nanosheets covered with $TiO_2$, CdSe or CdS nanosheets covered with a metallic layer such as Cu, Ag, Au, Ni, Pd, Pt, Co, Fe, Ru, Os, Mn, Tc, Re, Cr, Mo, W, V, Nd, Ta, Ti, Zr, Hf.

These final particles or objects such as described above are also very useful as an absorbing and/or collecting element of a photovoltaic cell because of their better stability, enhanced electron/hole mobility and high absorption cross section.

As an example, CdSe nanosheets with big dimensions (more than 100 nm of lateral extension) can be covered with a doped shell (CdZnS doped with Ag$^+$ for example). This allows increasing the electronic mobility of the absorbing and collecting elements of a solar cell containing such final object: CdSe/CdTe, CdTe/CdSe, PbSe/PbS, ZnS/InP, CuInS2/ZnS, CdS/CuInS$_2$.

These final particles or objects such as described above are also very useful as field effect transistor due to their better stability, enhanced electron/hole mobility and a high density of charge carriers.

As an example, CdSe nanosheets with big dimensions (more than 100 nm of lateral extension) can be covered with a doped shell (CdZnS doped with Ag$^+$ for example). This allows enhancing the electronic mobility in the final objects. Equally, a low band gap semiconducting sheet covered with a high band gap semiconductor shell allows obtaining a high mobility while keeping an excitonic structure. PbS nanosheets covered with a layer of CdS is an example of final particles or objects useful for field effect transistor applications.

Another aspect of the invention relates to a luminescent system, an electroluminescent system, an amplifying stage of a laser, a high specific surface and crystallinity catalyst of controlled surface, an absorbing and/or collecting element of a photovoltaic cell or a field effect transistor comprising an element obtained according to a process described according to one embodiment of the invention.

Other characteristics and advantages of the process according to the invention will appear after reading the detailed description and the examples given after as purely illustrative means.

EXAMPLES

Figure 1:
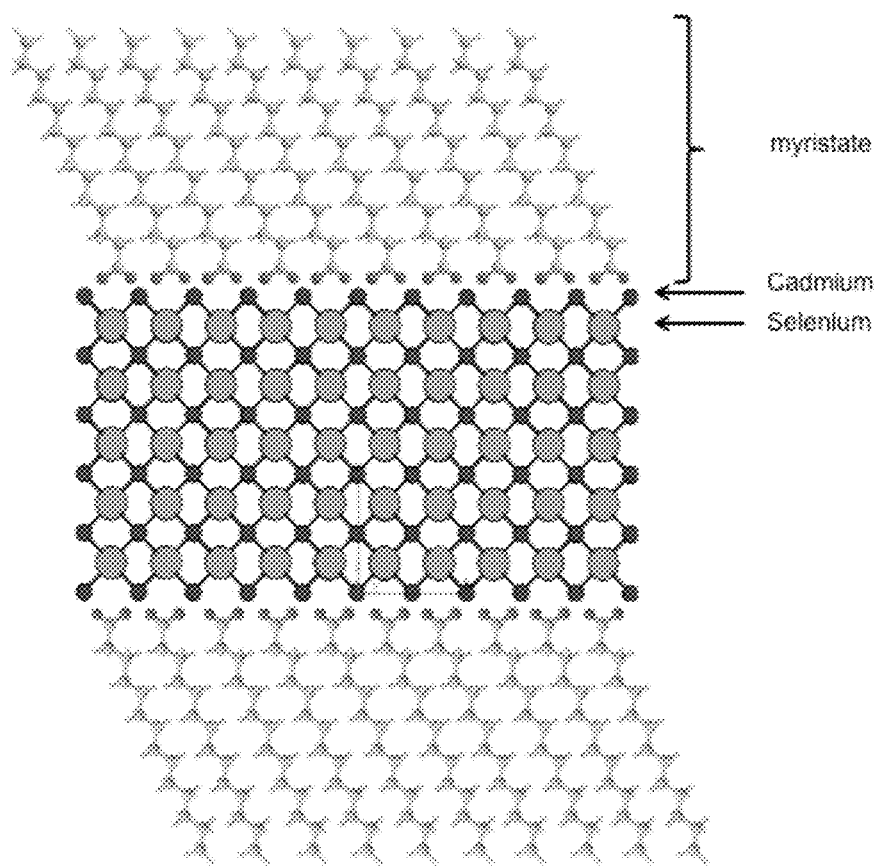
FIG. 1 shows the crystalline structure of a CdSe nanosheet seen in sectional view according to one embodiment of the invention.

Initial Nanosheets:

The initial nanosheets on which a process of growth in the thickness according to at least one embodiment of the invention is particularly efficient are the nanosheets having a surface charge. This surface charge can be positive or negative depending on the nature of the initial nanosheet considered. The semiconducting nanosheets such as described above (for example CdSe, CdS or CdTe) belong to this class of materials and will be taken as non-limitative examples of initial nanosheets. Such a sheet whose structure is schematized in FIG. 1 has a zinc-blende structure, a [0, 0, 1] zone axis and has a cationic surface stabilized by carboxylates on each facet of the sheet. These facets are perfectly polar (in this case cationic).

CdSe nanosheets for example can be obtained by any method known to a person skilled in the art, such as described for example in the following documents: Ithurria, S.; Dubertret, B. Journal of the American Chemical Society 2008, 130, 16504-5 and Ithurria, S.; Bousquet, G.; Dubertret, B. Journal of the American Chemical Society 2011, 133, 3070-7. 174 mg of Cd(myristate)$_2$ and 12 mg of selenium are introduced in a three-necked round-bottomed flask containing 16 mL of 1-octadecene (ODE, 90%). The flask is degased under reduced pressure and stirring at room temperature for 30 minutes. Argon is introduced in the flask which is then heated. When the temperature reaches 200° C., 40 mg of Cd(acetate)$_2$(H$_2$O)$_2$ are rapidly introduced in the reaction medium inducing the growth of the nanosheets. The reaction mixture is heated at 240° C., temperature at which it is held for approximately 10 minutes in order to ensure the growth of the sheets. The solution is then cooled down and washed by successive precipitation/suspension. The first precipitation is done by addition of a non-solvent: ethanol (80 mL approximately) and centrifugation (5000 rpms for 10 minutes). The supernatant is discarded and the precipitate is suspended in hexane (10 mL approximately). The sheets' solution still contains a lot of Cd(myristate)$_2$ in excess. Adding a few milliliters of octylamine (4 mL) allows its dissolution. The suspension of nanoplatelets is then precipitated a second time by addition of ethanol (80 mL) and centrifugation. The suspension/precipitation process is repeated twice more with octylamine and one last time simply by suspension in hexane and precipitation with ethanol. The final precipitate is suspended in 10 mL of chloroform (CHCl$_3$). The as-obtained sheets have the structure schematized in FIG. 1 which shows the crystalline structure of a CdSe sheet seen in sectional view.

Deposition of a Film of Chalcogenides on the Sheets

One describes for example the deposition of a CdS film on initial CdSe sheets according to one embodiment of the invention.

In a vial are successively introduced 2 mL of chloroform, 400 μL of the CdSe sheets solution, 20 mg of thioacetamide (TAA) as well as 200 μL of octylamine. The solution is placed under magnetic stirring for 1 h which causes the dissolution of TAA and a color change of the solution. 200 μL of a 0.1 M solution of Cd(oleate)$_2$ in a 4:1 solution of octylamine and oleic acid are then injected in the solution of sheets. Again, it gradually changes color while the fluorescence quantum yield greatly increases. The precursors are left reacting on the sheets for 2 h. The sheets are then aggregated by addition of a few drops of ethanol and the solution is centrifuged for 5 minutes at 5000 rpms. The supernatant containing the unreacted precursors as well as parasite CdS nanocrystals is discarded and the pellet containing the sheets is dispersed in 2 mL of chloroform to which 20 μL of a 0.5 M solution of Cd(oleate)$_2$ in oleic acid are added. The fluorescence quantum yield drops drastically. It increases afterwards under UV illumination.

Figure 2:
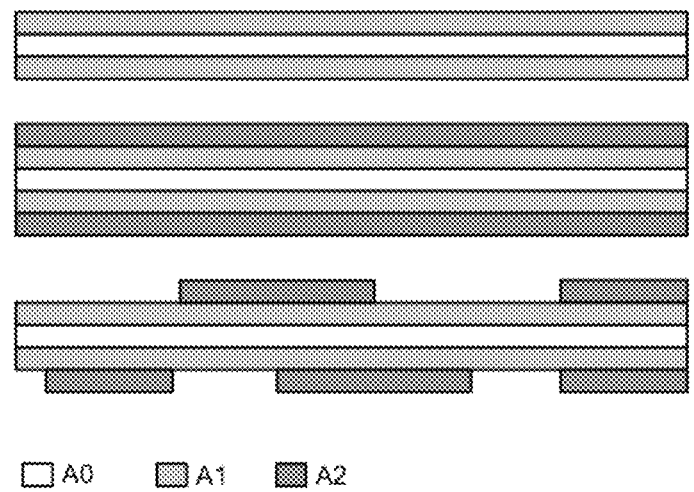
FIG. 2 shows the schematic structure of a heterostructured nanosheet seen in sectional view according to one embodiment of the invention.

The process according to this embodiment allows depositing a film of CdS on each side of the CdSe sheets. The thickness of the film is controlled by the reaction time and the quantity of precursors introduced in the reaction medium. The final structure of the as-obtained sheets is schematized in FIG. 2, where A0 is CdSe and A1 is CdS.

Deposition of a Film of Oxides on the Sheets.

One describes for example the deposition of a film of zinc oxide (ZnO) on the initial CdSe sheets according to one embodiment of the invention.

2 mL of the solution of CdSe sheets in CHCl$_3$ are introduced in a vial and placed under magnetic stirring. 5 mg of tetramethylammonium hydroxide as well as 30 mg of Zn(stearate)$_2$ are dissolved in 2 mL of octylamine. This solution is then added dropwise for 2 h in the solution of sheets. The color of the solution changes during the injection. After 2 h of reaction, the sheets are precipitated by addition of ethanol and centrifuged. They are dispersed in 2 mL of chloroform.

The process according to this embodiment of the invention allows depositing a film of ZnO on each side of the CdSe sheets. The thickness of the film is controlled by the reaction time and the quantity of precursors introduced in the reaction medium. The final structure of the as-obtained sheets is schematized in FIG. 2, where A0 is CdSe, and A1 is ZnO.

Deposition of a Metallic Film

One describes for example the deposition of gold on the initial CdSe nanosheets according to one embodiment of the invention. These sheets have a positive surface charge and it is first of all necessary to invert it. This inversion is done by deposition of a monolayer of sulfur at the surface of the sheets.

2 mL of the solution of CdSe sheets in CHCl$_3$ as well as 100 μL of a solution of tetramethylammonium sulfide (1 M) in ethanol are introduced in a vial. Under stirring the color of the solution containing the sheets changes immediately and the sheets aggregate. After 10 minutes of reaction, the sheets are precipitated by centrifugation. The supernatant is discarded and the sheets are washed twice with ethanol. The sheets are suspended in distilled water.

One then adds dropwise in the solution of sheets a solution of HAuCl$_4$ at 0.1 M. The color of the solution changes progressively due to the deposition of gold at the sheets' surface. The final sheets are washed twice by precipitation with ethanol. The final structure of the as-obtained sheets according to at least this embodiment of the invention is schematized in FIG. 2 where A0 is CdSe, and A1 is gold (Au).

According to another embodiment of the invention, one describes for example the deposition of a gold layer on initial nanosheets.

In a vial are successively added 2 mL of chloroform, 400 μL of the solution of CdSe sheets, 20 mg of thioacetamide (TAA) as well as 200 μL of octylamine. The solution is submitted to sonication for 5 minutes, which causes the complete dissolution of TAA as well as a color change from yellow to orange. The sheets are then aggregated by addition of a few drops of ethanol and the solution is centrifuged for 5 minutes at 5000 rpms. The supernatant containing the unreacted precursors is discarded and the pellet containing the sheets is dispersed in 2 mL of toluene. 2 mL of a solution of gold precursors and ligands prepared by dissolution in 10 mL of toluene of 10 mg of AuCl$_3$, 80 mg of didodecyldimethylammonium bromide as well as 120 mg of dodecylamine are added. The mixture is left reacting for 15 minutes. The resulting core/shell objects are precipitated by centrifugation for 5 minutes at 5000 rpms, the supernatant is discarded and the pellet dispersed in 2 mL of toluene.

Deposition of an Alloyed Film

One describes for example the deposition of an alloy of cadmium sulfide and zinc sulfide CdZnS on the initial CdSe nanosheet, according to one embodiment of the invention.

In a vial are successively introduced 2 mL of chloroform, 400 μL of the CdSe sheets solution, 20 mg of thioacetamide (TAA) as well as 200 μL of octylamine. The solution is placed under magnetic stirring for 1 h which causes the complete dissolution of TAA and a color change of the solution. 200 μL of a 0.05 M Cd(oleate)$_2$ and 0.05 M Zn(oleate)$_2$ in a 4:1 octylamine and oleic acid solution are then rapidly injected in the sheets' solution. It again gradually changes color while the quantum yield greatly increases. The precursors are left reacting for 2 h. The sheets are then aggregated by addition of a few drops of ethanol and the solution is centrifuged for 5 minutes at 5000 rpm. The supernatant containing the unreacted precursors as well as CdZnS parasite nanocrystals is discarded and the pellet containing the sheets is dispersed in 2 mL of chloroform. 20 μL of a 0.5 M solution of Zn(oleate)$_2$ in oleic acid are added.

The quantum yield then drops drastically. It increases afterwards under UV illumination.

The process according to this embodiment allows depositing a film of CdZnS on each side of the CdSe sheets. The thickness of this film is controlled by the reaction time and the quantity of precursors introduced in the reaction medium. The final structure of the as-obtained sheets is schematized in FIG. 2, where A0 is CdSe, and A1 is CdZnS.

One describes for example the deposition of an alloy of cadmium sulfide and zinc sulfide $Cd_{0.7}Zn_{0.3}S$ on the initial CdSe sheets, according to one embodiment of the invention.

Figure 4:
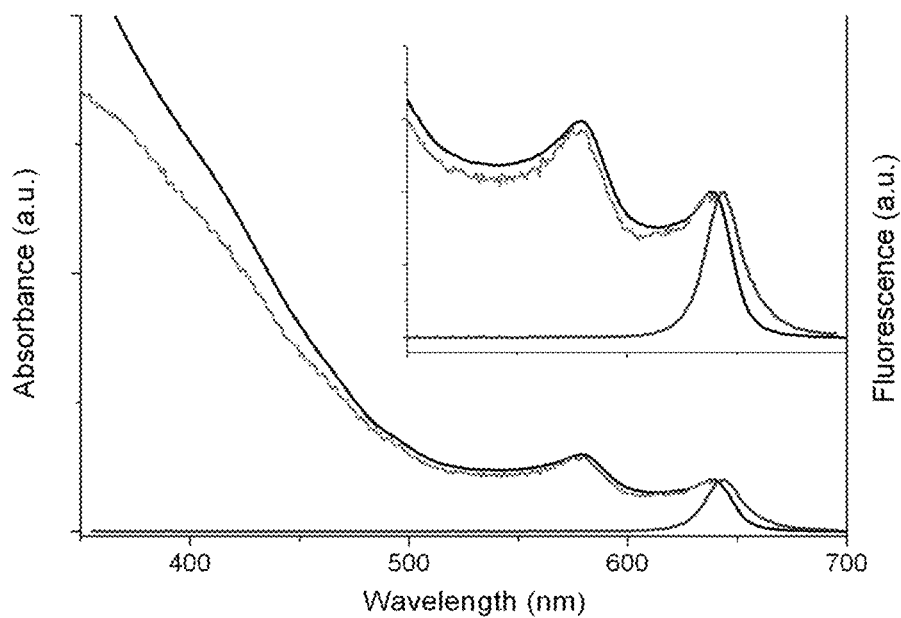
FIG. 4 shows the absorbance (black), fluorescence (red) and photoluminescence excitation (grey) spectra of core/shell nanosheets whose initial sheet is made of CdSe and the shell of $Cd_{0.7}Zn_{0.3}S$ as obtained according to one embodiment of the invention described as example.
Figure 5:
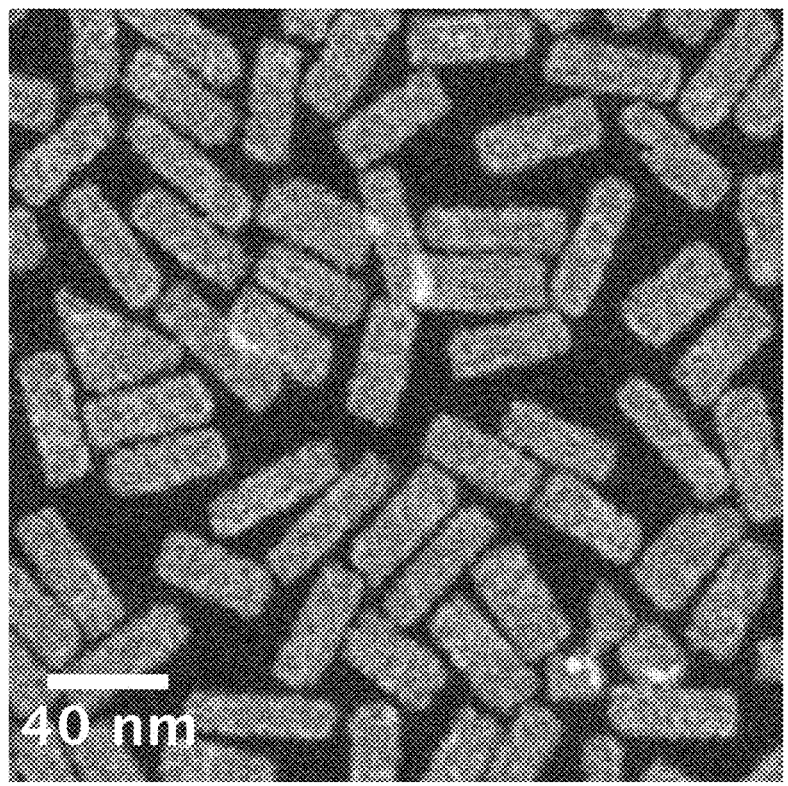
FIG. 5 shows a transmission electron microscopy image using a high-angle annular dark-field detector of core/shell nanosheets lying flat whose initial sheet is made of CdSe and the shell of $Cd_{0.7}Zn_{0.3}S$ as obtained according to one embodiment of the invention described as example.
Figure 6:
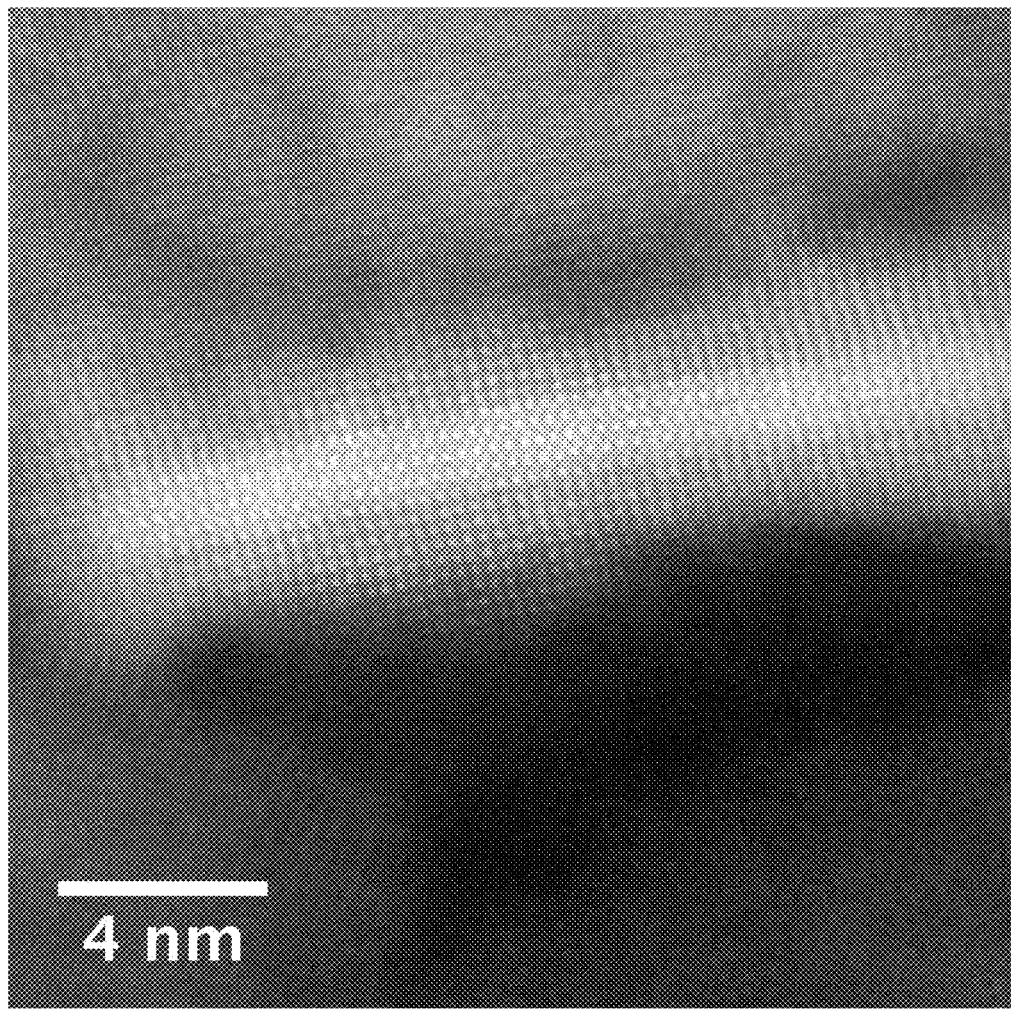
FIG. 6 shows a high resolution transmission electron microscopy image using a high-angle annular dark-field detector of core/shell nanosheets lying on their edge whose initial sheet is made of CdSe (appears clearer) and the shell of $Cd_{0.7}Zn_{0.3}S$ (appears darker) as obtained according to one embodiment of the invention described as example.

In a vial are successively introduced 4 mL of chloroform, 1 mL of the CdSe sheets solution, 100 mg of thioacetamide (TAA) and 1 mL of octylamine. The solution is submitted to sonication for 5 minutes which causes the complete dissolution of TAA and a color change of the solution from yellow to orange. 350 µL of a 0.2 M solution of $Cd(NO_3)_2$ in ethanol and 150 µL of a 0.2 M solution of $Zn(NO_3)_2$ in ethanol are rapidly injected in the sheets' solution. It gradually changes colors while the quantum yield greatly increases. The precursors are left reacting for another 24 h at room temperature. The sheets are then aggregated by addition of a few drops of ethanol and the solution is centrifuged for 5 minutes at 4000 rpms. The supernatant containing the unreacted precursors as well as parasite CdZnS nanocrystals is discarded and the pellet containing the sheets is dispersed in 5 mL of chloroform. In order to increase the stability and the quantum yield of the sheets, 100 µL of a 0.2 M solution of $Zn(NO_3)_2$ in ethanol are added to the solution of platelets. They instantly aggregate and are dispersed by addition of 200 µL of oleic acid. The core/shell nanosheets obtained according to this embodiment feature the absorption (black), fluorescence (red) and photoluminescence excitation (grey) spectra shown in FIG. 4. Their morphology is characterized by transmission electron microscopy using a high angle annular dark field (HAADF) detector. Many nanosheets lying flat can be seen in FIG. 5 while a high resolution image (FIG. 6) allows distinguishing the initial nanosheet (bright) from the shell (darker).

The process according to this embodiment of the invention allows depositing a film of CdZnS on each side of the CdSe nanosheets. The thickness of the film is controlled by the reaction time and the quantity of precursors used in the reaction medium. The final structure of the as-obtained sheets is schematized in FIG. 2, where A0 is CdSe, and A1 is CdZnS.

Deposition of a Doped Film

One describes for example the deposition of a film of zinc sulfide doped with manganese on the initial CdSe sheets according to one embodiment of the invention.

In a vial are successively introduced 2 mL of chloroform, 400 µL of the CdSe sheets solution, 20 mg of thioacetamide (TAA) as well as 200 µL of octylamine. The solution is placed under magnetic stirring for 1 h which causes the complete dissolution of TAA and a color change of the solution. 200 µL of a 0.1 M solution of $Zn(undecanoate)_2$ and 0.01 M solution of $Mn(undecanoate)_2$ are then rapidly introduced in the sheets' solution. It again gradually changes color while the fluorescence quantum yield greatly increases. The precursors are left reacting for another 2 h. The sheets are then aggregated by addition of a few drops of ethanol and the solution is centrifuged for 5 minutes at 5000 rpm. The supernatant containing the unreacted precursors as well as ZnS parasite nanocrystals is discarded and the pellet containing the sheets is dispersed in 2 mL of chloroform. 20 µL of a 0.5 M solution of $Zn(oleate)_2$ in oleic acid are added. The quantum yield then drops drastically. It increases afterwards under UV illumination.

The process according to this embodiment of the invention allows depositing a film of manganese-doped ZnS on each side of the CdSe nanosheets. The thickness of the film is controlled by the reaction time and the quantity of precursors used in the reaction medium. The final structure of the as-obtained sheets is schematized in FIG. 2, where A0 is CdS, and A1 is manganese-doped ZnS.

Successive Deposition of Several Films of Different Chemical Composition

One describes for example the deposition of a film of cadmium sulfide then of zinc sulfide on the initial CdSe nanosheets according to one embodiment of the invention.

In a vial are successively introduced 2 mL of chloroform, 400 µL of the CdSe sheets solution, 20 mg of thioacetamide (TAA) as well as 200 µL of octylamine. The solution is placed under magnetic stirring for 1 h which causes the complete dissolution of TAA and a color change of the solution. 200 µL of a 0.1 M solution of $Cd(oleate)_2$ in a 4:1 octylamine and oleic acid solution are then rapidly added in the solution. It again gradually changes color while the fluorescence quantum yield greatly increases. The precursors are left reacting for another 2 h. The sheets are then aggregated by addition of a few drops of ethanol and the solution is centrifuged for 5 minutes at 5000 rpm. The supernatant containing the unreacted precursors as well as CdS parasite nanocrystals is discarded and the pellet containing the sheets is dispersed in 2 mL of chloroform to which are added 20 µL of a 0.5 M solution of $Cd(oleate)_2$ in oleic acid. The quantum yield then drops drastically. It increases afterwards under UV illumination. The sheets are then precipitated with ethanol and redispersed in 2 mL of chloroform.

The process according to this embodiment allows depositing a film of CdS on each side of the CdSe nanosheets. The thickness of the film is controlled by the reaction time and the quantity of precursors used in the reaction medium.

For the deposition of the ZnS film, 20 mg of thioacetamide (TAA) as well as 200 µL of octylamine are introduced in the vial containing the CdSe/CdS sheets' solution in chloroform. The solution is placed under magnetic stirring for 1 h which causes the complete dissolution of TAA and a color change of the solution. 200 µL of a 0.1 M solution of $Zn(undecanoate)_2$ in octylamine are then rapidly injected in the solution. It again gradually changes color while the fluorescence quantum yield greatly increases. The precursors are left reacting for another 2 h. The sheets are then aggregated by addition of a few drops of ethanol and the solution is centrifuged for 5 minutes at 5000 rpm. The supernatant containing the unreacted precursors as well as ZnS parasite nanocrystals is discarded and the pellet containing the sheets is dispersed in 2 mL of chloroform to which are added 20 µL of a 0.5 M solution of $Zn(oleate)_2$ in oleic acid.

The process according to this embodiment of the invention has thus allowed depositing a ZnS film on each side of the CdSe/CdS sheets. The thickness of the film is controlled by the reaction time and the quantity of precursors used in the reaction medium.

The process according to this embodiment of the invention has thus allowed synthesizing sheets of CdSe/CdS/ZnS structure by depositing a cadmium sulfide film then a zinc sulfide film on the CdSe initial nanosheets. The final structure of the as-obtained sheets is schematized in FIG. 2, where A0 is CdSe, and A1 is CdS and A2 is ZnS.

Immobilization De Sheets on a Substrate then Growth:

A microscope glass slide (26 mm by 26 mm) is cleaned with an oxygen plasma. It is then functionalized with 3-mercaptopropyl-triethoxysilane by immersion for 10 minutes in a 1% in volume solution of 3-mercaptopropyl-triethoxysilane in ethanol. The glass slide is rinsed 3 times with ethanol then dried. It is then immersed for 1 h in a solution of CdSe sheets dispersed in chloroform. The sheets adsorb at the surface of the glass slide and form a monolayer of sheets. The slide is rinsed twice with chloroform in order to eliminate sheets that are not bound to the substrate.

Figure 3:
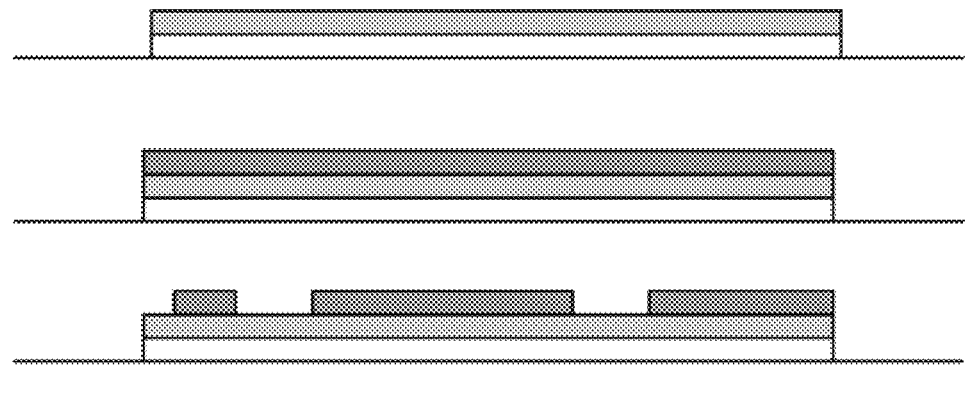
FIG. 3 shows the schematic structure of a heterostructured nanosheet obtained by growth after immobilization on a substrate seen in sectional view according to one embodiment of the invention.

The slide is immersed in a few milliliters of ethanol in which 20 mg of thioacetamide (TAA) have been dissolved. After 1 h of reaction, 1 mL of a 0.1 M solution of $Cd(acetate)_2(H_2O)_2$ in ethanol are slowly injected dropwise for 1 h and left reacting for another hour. After rinsing twice with ethanol, the glass slide is thus covered with a layer of CdSe/CdS sheets. The final structure of the as-obtained sheets is schematized in FIG. 3, where A0 is CdSe, and A1 is CdS.

As obvious and as already resulting from the foregoing, the invention is in no way limited to those modes of applications and achievements that have been especially considered, it encompasses all variants without departing from the scope of the invention as defined by the claims.

BIBLIOGRAPHY (1) Ekimov, A. JETP Lett 1981, 34, 345-348.
(2) Alivisatos, A. P. Science 1996, 271, 933-937.
(3) Vassiliou, J.; Mehrotra, V.; Russell, M. J. Appl. Phys 1993, 5109-5116.
(4) El-Sayed, M. A. Accounts of chemical research 2004, 37, 326-33.
(5) Ma, R.; Sasaki, T. Advanced materials 2010, 22, 5082-104.
(6) Sasaki, T.; Watanabe, M. The Journal of Physical Chemistry B 1997, 101, 10159-10161.
(7) Hernandez, Y.; Nicolosi, V.; Lotya, M.; Blighe, F. M.; Sun, Z.; De, S.; McGovern, I. T.; Holland, B.; Byrne, M.; Gun'Ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N. Nature nanotechnology 2008, 3, 563-8.
(8) Vaughn, D. D.; Patel, R. J.; Hickner, M. A; Schaak, R. E. Journal of the American Chemical Society 2010, 132, 15170-2.
(9) Mehta, R. J.; Karthik, C.; Singh, B.; Teki, R.; Borca-Tasciuc, T.; Ramanath, G. ACS nano 2010, 4, 5055-60.
(10) Kumar, S.; Nann, T. Small 2006, 2, 316-29.
(11) Jun, Y.-wook; Choi, J.-sil; Cheon, J. Angewandte Chemie (International ed. in English) 2006, 45, 3414-39.
(12) Xu, S.; Sun, X.; Ye, H.; You, T.; Song, X.; Sun, S. Materials Chemistry and Physics 2010, 120, 1-5.
(13) Li, C. C.; Cai, W. P.; Cao, B. Q.; Sun, F. Q.; Li, Y.; Kan, C. X.; Zhang, L. D. Advanced Functional Materials 2006, 16, 83-90.
(14) Sigman, M. B.; Ghezelbash, A.; Hanrath, T.; Saunders, A. E.; Lee, F.; Korgel, B. a Journal of the American Chemical Society 2003, 125, 16050-7.
(15) Deng, Z.; Mansuripur, M.; Muscat, A. J. Journal of Materials Chemistry 2009, 19, 6201.
(16) Puntes, V. F.; Zanchet, D.; Erdonmez, C. K.; Alivisatos, a P. Journal of the American Chemical Society 2002, 124, 12874-80.
(17) Si, R.; Zhang, Y.-W.; You, L.-P.; Yan, C.-H. Angewandte Chemie (International ed. in English) 2005, 44, 3256-60.
(18) Zhang, G.; Sun, S.; Li, R.; Zhang, Y.; Cai, M.; Sun, X. Chemistry of Materials 2010, 22, 4721-4727.
(19) Sun, Y.; Xia, Y. Science 2002, 298, 2176-9.
(20) Ah, C. S.; Yun, Y. J.; Park, H. J.; Kim, W.-J.; Ha, D. H.; Yun, W. S. Chemistry of Materials 2005, 17, 5558-5561.
(21) Huang, W. L.; Chen, C.-hua; Huang, M. H. The Journal of Physical Chemistry C 2007, 111, 2533-2538.
(22) Deng, Z.; Mansuipur, M.; Muscat, A. J. The Journal of Physical Chemistry C 2009, 113, 867-873.
(23) Yu, T.; Joo, J.; Park, Y. I.; Hyeon, T. Journal of the American Chemical Society 2006, 128, 1786-7.
(24) Xu, R.; Xie, T.; Zhao, Y.; Li, Y. Crystal Growth & Design 2007, 7, 1904-1911.
(25) Yu, J. C.; Xu, A.; Zhang, L.; Song, R.; Wu, L. The Journal of Physical Chemistry B 2004, 108, 64-70.
(26) Joo, J.; Son, J. S.; Kwon, S. G.; Yu, J. H.; Hyeon, T. Journal of the American Chemical Society 2006, 128, 5632-3.
(27) Yu, J. H.; Liu, X.; Kweon, K. E.; Joo, J.; Park, J.; Ko, K.-T.; Lee, D. W.; Shen, S.; Tivakornsasithorn, K.; Son, J. S.; Park, J.-H.; Kim, Y.-W.; Hwang, G. S.; Dobrowolska, M.; Furdyna, J. K.; Hyeon, T. Nature materials 2010, 9, 47-53.
(28) Yu, S. H.; Yoshimura, M. Advanced Materials 2002, 14, 296-300.
(29) Li, J.; Xu, Y.; Wu, D.; Sun, Y. Solid State Communications 2004, 130, 619-622.
(30) Yao, W.-T.; Yu, S.-H.; Pan, L.; Li, J.; Wu, Q.-S.; Zhang, L.; Jiang, J. Small 2005, 1, 320-5.
(31) Fan, L.; Song, H.; Zhao, H.; Pan, G.; Yu, H.; Bai, X.; Li, S.; Lei, Y.; Dai, Q.; Qin, R.; Wang, T.; Dong, B.; Zheng, Z.; Ren, X. The journal of physical chemistry. B 2006, 110, 12948-53.
(32) Park, K. H.; Jang, K.; Son, S. U. Angewandte Chemie (International ed. in English) 2006, 45, 4608-12.
(33) Han-Mei, H.; Chong-Hai, D.; Xian-Huai, H.; Yan, L.; Mei, S.; Ke-Hua, Z. CHINESE JOURNAL OF INORGANIC CHEMISTRY 2007, 23, 1403-1408.
(34) Huang, X.; Li, J. Journal of the American Chemical Society 2007, 129, 3157-62.
(35) Huang, X.; Li, J.; Zhang, Y.; Mascarenhas, A. Journal of the American Chemical Society 2003, 125, 7049-55.
(36) Son, J. S.; Wen, X.-D.; Joo, J.; Chae, J.; Baek, S.-I.; Park, K.; Kim, J. H.; An, K.; Yu, J. H.; Kwon, S. G.; Choi, S.-H.; Wang, Z.; Kim, Y.-W.; Kuk, Y.; Hoffmann, R.; Hyeon, T. Angewandte Chemie (International ed. in English) 2009, 48, 6861-4.
(37) Ithurria, S.; Dubertret, B. Journal of the American Chemical Society 2008, 130, 16504-5.
(38) Ithurria, S.; Bousquet, G.; Dubertret, B. Journal of the American Chemical Society 2011, 133, 3070-7.
(39) Li, Z.; Peng, X. Journal of the American Chemical Society 2011, 133, 6578-86.
(40) Hines, M. a; Guyot-Sionnest, P. The Journal of Physical Chemistry 1996, 100, 468-471.
(41) Peng, X. Chemistry 2002, 8, 334-9.
(42) Trindade, T.; O'Brien, P.; Zhang, X.-mei Chemistry of Materials 1997, 9, 523-530.
(43) Mane, R. Materials Chemistry and Physics 2000, 65, 1-31.
(44) Nicolau, Y. Applications of Surface Science 1985, 22, 1061-1074.

The invention claimed is:

1. An inorganic colloidal nanoparticle comprising an initial inorganic nanosheet with thickness less than 1 μm and lateral dimensions at least 1.5 times greater than thickness, at least one layer of inorganic material covering said initial inorganic nanosheet so as to increase thickness of said initial inorganic nanosheet, wherein the initial inorganic nanosheet and the at least one layer of inorganic material comprise at least two different materials.

2. The inorganic colloidal nanoparticle according to claim 1, wherein the inorganic colloidal nanoparticle is a nanosheet.

3. The inorganic colloidal nanoparticle according to claim 1, wherein the inorganic colloidal nanoparticle has a thickness of 0.5 nm to 10 mm.

4. The inorganic colloidal nanoparticle according to claim 1, wherein the inorganic colloidal nanoparticle has a lateral size larger than 0.75 nm.

5. The inorganic colloidal nanoparticle according to claim 1, wherein the initial nanosheet and the at least one layer comprise a material MxEy, wherein M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, and a mixture thereof, E is selected from the group consisting of O, S, Se, Te, N, P, As, F, Cl, Br, I, and a mixture thereof, and x and y are independently a decimal number from 0 to 5.

6. The inorganic colloidal nanoparticle according to claim 1, wherein the initial nanosheet and the at least one layer comprise a material selected from the group consisting of group II-VI, group II-V, group group III-V, group IV-VI, group group II-IV-VI, group II-IV-V and a mixture thereof.

7. The inorganic colloidal nanoparticle according to claim 1, wherein the initial nanosheet and the at least one layer comprise a material selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, and a mixture thereof.

8. The inorganic colloidal nanoparticle according to claim 1, wherein the at least one layer is doped by a transition metal or a lanthanide.

9. A product comprising at least one inorganic colloidal nanoparticle according to claim 1, wherein the product is a luminescent system or an electroluminescent system or an amplifying stage of a laser, or a catalyst or a photovoltaic cell or a transistor.

10. The inorganic colloidal nanoparticle according to claim 1, wherein thickness of initial inorganic nanosheet is greater than 0.3 nm and less than 500 nm.

11. An inorganic colloidal nanoparticle comprising an initial inorganic nanosheet with thickness less than 1 μm and lateral dimensions at least 1.5 times greater than thickness, and at least two layers of inorganic material wherein first layer covers all or part of said initial inorganic nanosheet so as to increase thickness of said initial inorganic nanosheet, wherein second layer covers all or part of the first layer; and wherein the initial inorganic nanosheet and the at least two layers of inorganic material are of different compositions.

* * * * *